(12) United States Patent
Otsubo et al.

(10) Patent No.: US 10,593,605 B2
(45) Date of Patent: Mar. 17, 2020

(54) SEMICONDUCTOR PACKAGE

(71) Applicant: Mitsubishi Electric Corporation, Tokyo (JP)

(72) Inventors: Yoshitaka Otsubo, Tokyo (JP); Masayuki Ando, Tokyo (JP); Kota Ohara, Tokyo (JP); Takamasa Oda, Fukuoka (JP); Takuro Mori, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/188,772

(22) Filed: Nov. 13, 2018

(65) Prior Publication Data

US 2019/0304859 A1     Oct. 3, 2019

(30) Foreign Application Priority Data

Mar. 27, 2018   (JP) .................. 2018-060114

(51) Int. Cl.
| | |
|---|---|
| *H01L 23/48* | (2006.01) |
| *H01L 23/10* | (2006.01) |
| *H01L 23/053* | (2006.01) |
| *H01L 23/373* | (2006.01) |
| *H01L 23/00* | (2006.01) |

(52) U.S. Cl.
CPC ............ *H01L 23/10* (2013.01); *H01L 23/053* (2013.01); *H01L 23/3735* (2013.01); *H01L 24/73* (2013.01); *H01L 2224/73265* (2013.01); *H01L 2924/1033* (2013.01); *H01L 2924/10253* (2013.01); *H01L 2924/10254* (2013.01); *H01L 2924/10272* (2013.01)

(58) Field of Classification Search
CPC .... H01L 23/053; H01L 23/3735; H01L 24/73
USPC .................. 257/695, 696, 698, 700
See application file for complete search history.

(56) References Cited

U.S. PATENT DOCUMENTS 6,259,348 B1 *  7/2001  Kuriyama ............ H01G 9/0003
                                                      337/232

FOREIGN PATENT DOCUMENTS

JP       2000-138107 A      5/2000

* cited by examiner

*Primary Examiner* — Tan N Tran
(74) *Attorney, Agent, or Firm* — Studebaker & Brackett PC

(57) ABSTRACT

A semiconductor package includes: an insulating substrate having a circuit pattern; a semiconductor device provided on the circuit pattern; a case surrounding the semiconductor device on the insulating substrate; an external terminal electrically connecting inside and outside of the case; an inner wire electrically connecting the circuit pattern or the semiconductor device with an inner end portion of the external terminal; a sealing resin sealing the semiconductor device and the inner wire inside the case; and a lid covering an upper surface of the sealing resin, wherein the inner wire includes a fusion portion that fuses when excessive current flows, and the lid includes a scattering prevention part covering the fusion portion while securing a gap between the scattering prevention part and the upper surface of the sealing resin, and is fixed to the upper surface of the sealing resin in a region other than the scattering prevention part.

19 Claims, 2 Drawing Sheets

SEMICONDUCTOR PACKAGE

BACKGROUND OF THE INVENTION

Field

The present invention relates to a semiconductor package.

Background

Semiconductor packages are used in various applications such as power generation, power transmission and effective utilization or regeneration of energy. It has been common practice to use part of internal wires as a fuse for providing protection from excessive current or short-circuit current in semiconductor packages sealed in epoxy-based or polyimide-based sealing resin. One problem was that when the wire was fused and cut, part of the wire was sometimes blown off with the surrounding molding resin and material droplets were scattered around the semiconductor package, adversely affecting other devices. To prevent this problem, a technique whereby the entire semiconductor package is coated with a rubber film has been proposed (see, for example, Japanese Patent Application Publication No. 2000-138107).

SUMMARY

However, when the semiconductor package has a complex shape, it is difficult to coat it entirely with a rubber film. Another problem was that covering the package with a rubber film that has poor heat conductivity would compromise heat dissipation during the normal use.

The present invention was made to solve the problem described above and it is an object of the invention to provide a readily producible semiconductor package that can prevent scattering of material droplets without compromising heat dissipation.

A semiconductor package according to the present invention includes: an insulating substrate having a circuit pattern; a semiconductor device provided on the circuit pattern; a case surrounding the semiconductor device on the insulating substrate; an external terminal electrically connecting inside and outside of the case; an inner wire electrically connecting the circuit pattern or the semiconductor device with an inner end portion of the external terminal; a sealing resin sealing the semiconductor device and the inner wire inside the case; and a lid covering an upper surface of the sealing resin, wherein the inner wire includes a fusion portion that fuses when excessive current flows, and the lid includes a scattering prevention part covering the fusion portion while securing a gap between the scattering prevention part and the upper surface of the sealing resin, and is fixed to the upper surface of the sealing resin in a region other than the scattering prevention part.

According to the present invention, the fusion portion that fuses when excessive current flows is intentionally provided to the inner wire. The fracture energy of the fusion portion is released from the upper surface of the package, so that the electric current path can be disconnected in a short time. The lid includes a scattering prevention part that covers the fusion portion from above while securing a gap between itself and the upper surface of the sealing resin, and is fixed to the upper surface of the sealing resin in a region other than the scattering prevention part. Thus the scattering of material droplets can be prevented and adverse effects to other devices can be suppressed. The production is easy because the lid is simply provided with the scattering prevention part, and heat dissipation will not be compromised.

Other and further objects, features and advantages of the invention will appear more fully from the following description.

DESCRIPTION OF EMBODIMENTS

Figure 1:
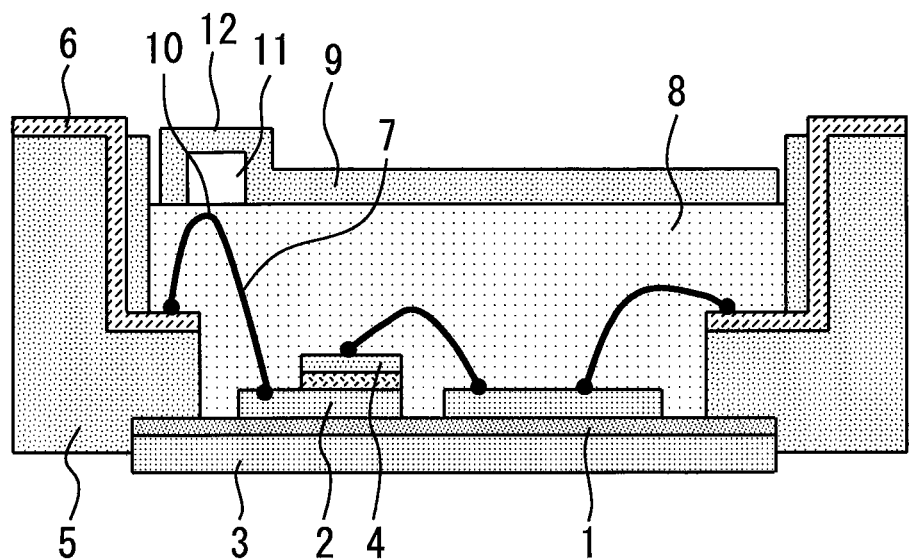
FIG. 1 is a cross-sectional view illustrating a semiconductor package according to a first embodiment.

Semiconductor packages according to embodiments will be described with reference to the drawings. Same reference numerals may be given to like or corresponding constituent elements to omit repeated description.

First Embodiment

FIG. 1 is a cross-sectional view illustrating a semiconductor package according to a first embodiment. A circuit pattern 2 is formed on an upper surface of an insulating substrate 1, and a heat dissipation pattern 3 is formed on a lower surface of the substrate. The insulating substrate 1 is made of resin, while the circuit pattern 2 and heat dissipation pattern 3 are made of copper. A semiconductor device 4 is provided on the circuit pattern 2.

A case 5 surrounds the semiconductor device 4 on the insulating substrate 1. An external terminal 6 is provided to the case 5 to electrically connect the inside and outside of the case 5. An inner wire 7 electrically connects the circuit pattern 2 or semiconductor device 4 with an inner end portion of the external terminal 6. Sealing resin 8 seals the semiconductor device 4 and inner wire 7 inside the case 5. A lid 9 covers the upper surface of the sealing resin 8.

The inner wire 7 includes a fusion portion 10 near the upper surface of the sealing resin 8. The fusion portion 10 fuses when excessive current flows The current value with which the fusion portion 10 fuses is smaller than the surge withstand current of the semiconductor device 4. The lid 9 includes a scattering prevention part 12 that covers the fusion portion 10 from above while securing a gap 11 between itself and the upper surface of the sealing resin 8. The lid 9 is tightly fixed to the upper surface of the sealing resin 8 in a region other than the scattering prevention part 12.

In this embodiment, the fusion portion 10 that fuses when excessive current flows is provided to the inner wire 7 on purpose. The fracture energy of the fusion portion 10 is released from the upper surface of the package so that the electric current path can be disconnected in a short time. The lid 9 includes the scattering prevention part 12 that covers the fusion portion 10 from above while securing a gap 11 between itself and the upper surface of the sealing resin 8, and is tightly secured to the upper surface of the sealing resin 8 in a region other than the scattering prevention part 12. Thus scattering of material droplets can be prevented to avoid adverse effects to other devices. The production is easy because the lid 9 is simply provided with the scattering prevention part 12, and heat dissipation will hardly be compromised.

The fusion portion 10 is embedded in the sealing resin 8. The thickness a of the sealing resin 8 above the fusion portion 10 is smaller than four times the diameter of the fusion portion b (a<4b). The fusing characteristics of the fusion portion 10 can be controlled this way, and the fracture energy of the fusion portion 10 can be limited to the upper side of the sealing resin 8.

The scattering prevention part 12 is a bending portion formed by bending part of the lid 9 in C shape such as to protrude upward. This way, the gap 11 can readily be provided for the fusion portion 10 only. When the lower surface of the lid 9 other than the scattering prevention part 12 is flat, a tight bond with the sealing resin 8 can easily be achieved.

The inner wire 7 is, specifically, a bonding wire. When the inner wire 7 has a smaller wire diameter than other wires inside the package, or the number of inner wires is reduced, the inner wire 7 will fuse more easily than other wires. The fusion portion 10 which fuses when excessive current flows can be easily provided this way, by adjusting the wire diameter or number of the inner wire 7. Moreover, the inner wire 7 provided with the fusion portion 10 has a larger height than that of other wires inside the package. Therefore, the thickness a of the sealing resin 8 above the fusion portion 10 is small.

The sealing resin 8 contains an epoxy resin and an inorganic filler, for example. The sealing resin 8 therefore has high heat conductivity, so that heat can be dissipated from the heat dissipation pattern 3 side when in use even though the upper surface of the sealing resin 8 is covered by the lid 9. The scattering of material droplets can be prevented even when the sealing resin 8 is made of such a hard material.

Second Embodiment

Figure 2:
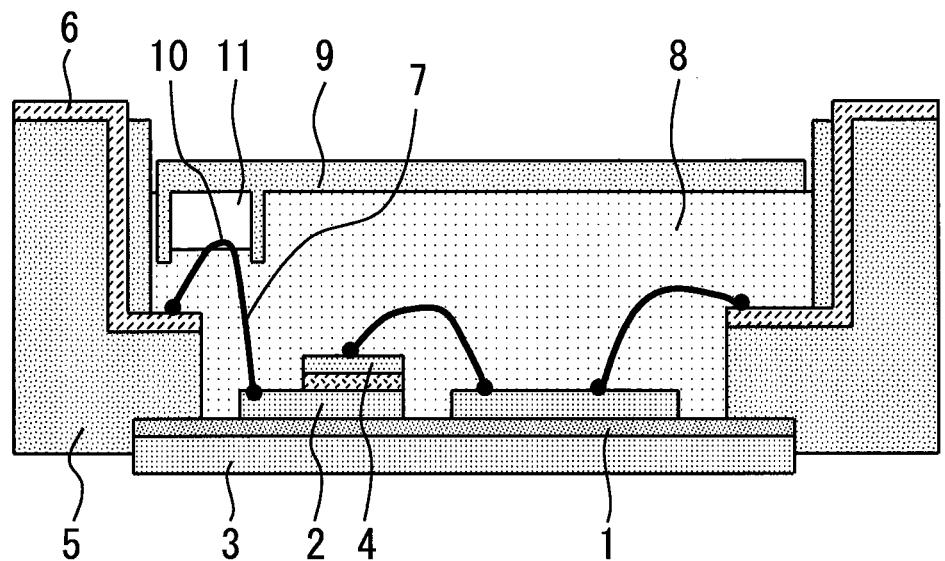
FIG. 2 is a cross-sectional view illustrating a semiconductor package according to a second embodiment.

FIG. 2 is a cross-sectional view illustrating a semiconductor package according to a second embodiment. The scattering prevention part 12 is a tubular portion provided on the lower surface of a flat part of the lid 9. The resin potting is carried out such that the sealing resin 8 does not fill the inside of this tubular portion, so that a gap 11 can easily be secured. This way, the scattering prevention part 12 can be provided at a height lower than the upper surface of the sealing resin 8, so that the semiconductor package can be made even smaller. Moreover, the lid 9 and the sealing resin 8 contact each other in a wider area and are bonded together firmly when the resin sets, so that scattering of material droplets can be prevented even more effectively.

The fusion portion 10 is exposed from the sealing resin 8. This allows the fusion portion 10 to have consistent fusing characteristics. Also, the fracture energy of the fusion portion 10 can be reduced, so that scattering of material droplets can be prevented even more effectively.

Third Embodiment

Figure 3:
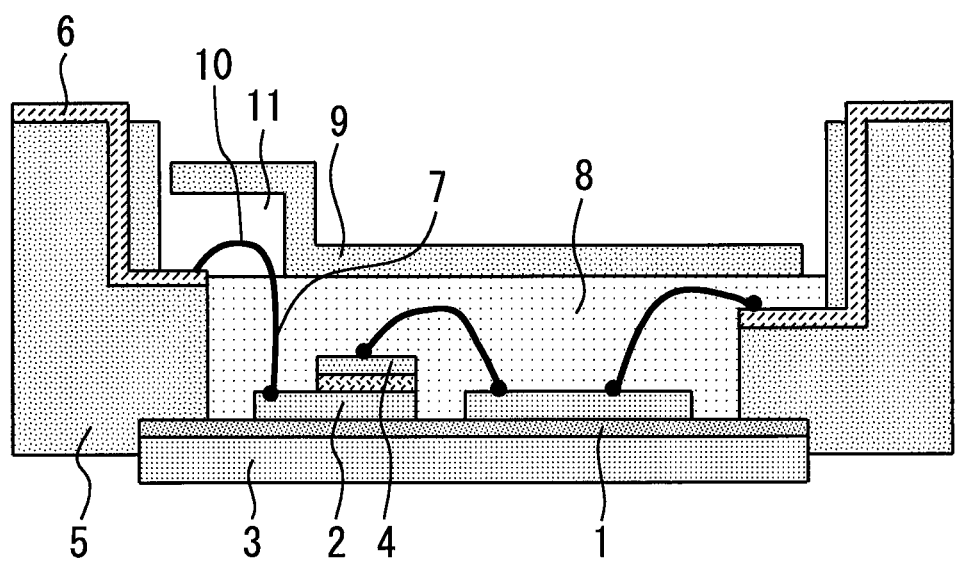
FIG. 3 is a cross-sectional view illustrating a semiconductor package according to a third embodiment.

FIG. 3 is a cross-sectional view illustrating a semiconductor package according to a third embodiment. The bonding surface of the external terminal 6 to be bonded with the inner wire 7 is positioned higher than the upper surface of the sealing resin 8 and is exposed from the sealing resin 8. Thus the fusion portion 10 can readily be exposed from the sealing resin 8. As a result, the fracture energy of the fusion portion 10 can be reduced, and scattering of material droplets can be prevented even more effectively.

The semiconductor device 4 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor package in which the semiconductor chip is incorporated. Further, since the semiconductor chip has a high heat resistance, a radiation fin of a heatsink can be miniaturized and a water-cooled part can be air-cooled, which leads to further miniaturization of the semiconductor package. Further, since the semiconductor chip has a low power loss and a high efficiency, a highly efficient semiconductor package can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-60114, filed on Mar. 27, 2018 including specification, claims, drawings and summary, on which the Convention priority of the present application is based, is incorporated herein by reference in its entirety.

The invention claimed is:

1. A semiconductor package comprising:
   an insulating substrate having a circuit pattern;
   a semiconductor device provided on the circuit pattern;
   a case surrounding the semiconductor device on the insulating substrate;
   an external terminal electrically connecting inside and outside of the case;
   an inner wire electrically connecting the circuit pattern or the semiconductor device with an inner end portion of the external terminal;
   a sealing resin sealing the semiconductor device and the inner wire inside the case; and
   a lid covering an upper surface of the sealing resin,
   wherein the inner wire includes a fusion portion that fuses when excessive current flows, and
   the lid includes a scattering prevention part covering the fusion portion while securing a gap between the scattering prevention part and the upper surface of the sealing resin, and is fixed to the upper surface of the sealing resin in a region other than the scattering prevention part.

2. The semiconductor package according to claim 1, wherein the fusion portion is embedded in the sealing resin, and
thickness of the sealing resin above the fusion portion is smaller than four times a diameter of the fusion portion.

3. The semiconductor package according to claim 2, wherein the scattering prevention part is a bending portion of the lid which protrudes upward.

4. The semiconductor package according to claim 2, wherein the scattering prevention part is a tubular portion provided on a lower surface of the lid.

5. The semiconductor package according to claim 2, wherein the inner wire is a bonding wire.

6. The semiconductor package according to claim 2, wherein the sealing resin contains an epoxy resin and an inorganic filler.

7. The semiconductor package according to claim 2, wherein the semiconductor device is made of a wide-bandgap semiconductor.

8. The semiconductor package according to claim 1, wherein the fusion portion is exposed from the sealing resin.

9. The semiconductor package according to claim 8, wherein the scattering prevention part is a bending portion of the lid which protrudes upward.

10. The semiconductor package according to claim 8, wherein the scattering prevention part is a tubular portion provided on a lower surface of the lid.

11. The semiconductor package according to claim 8, wherein a bonding surface of the external terminal to be bonded with the inner wire is positioned higher than the upper surface of the sealing resin and exposed from the sealing resin.

12. The semiconductor package according to claim 8, wherein the inner wire is a bonding wire.

13. The semiconductor package according to claim 8, wherein the sealing resin contains an epoxy resin and an inorganic filler.

14. The semiconductor package according to claim 8, wherein the semiconductor device is made of a wide-bandgap semiconductor.

15. The semiconductor package according to claim 1, wherein the scattering prevention part is a bending portion of the lid which protrudes upward.

16. The semiconductor package according to claim 1, wherein the scattering prevention part is a tubular portion provided on a lower surface of the lid.

17. The semiconductor package according to claim 1, wherein the inner wire is a bonding wire.

18. The semiconductor package according to claim 1, wherein the sealing resin contains an epoxy resin and an inorganic filler.

19. The semiconductor package according to claim 1, wherein the semiconductor device is made of a wide-bandgap semiconductor.

* * * * *